(12) United States Patent
Celedon et al.

(10) Patent No.: US 10,098,221 B2
(45) Date of Patent: Oct. 9, 2018

(54) HEAT TRANSFER ASSEMBLY PROVIDING HEAT TRANSFER FROM A MODULE MOUNTED ON A CIRCUIT BOARD THROUGH THE CIRCUIT BOARD

(71) Applicant: Applied Optoelectronics, Inc., Sugar Land, TX (US)

(72) Inventors: Rafael Celedon, Atlanta, GA (US); Mark Siejka, Winder, GA (US); Michael Jones, Grayson, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 15/275,785

(22) Filed: Sep. 26, 2016

(65) Prior Publication Data

US 2018/0092199 A1   Mar. 29, 2018

(51) Int. Cl.
*H05K 1/02* (2006.01)
*H05K 1/18* (2006.01)
*G02B 6/42* (2006.01)

(52) U.S. Cl.
CPC .......... *H05K 1/0204* (2013.01); *G02B 6/428* (2013.01); *G02B 6/4272* (2013.01); *G02B 6/4292* (2013.01); *H05K 1/18* (2013.01); *H05K 2201/10121* (2013.01)

(58) Field of Classification Search
CPC .. H05K 1/021; H05K 1/0204; H05K 7/20434; H05K 7/20963; H05K 3/0061
USPC ...................... 361/715, 719, 707; 398/43–50
See application file for complete search history.

(56) References Cited

U.S. PATENT DOCUMENTS

| | | | |
|---|---|---|---|
| 7,922,362 B2* | 4/2011 | Lin ...................... | H05K 1/0206 257/706 |
| 8,744,268 B2* | 6/2014 | Lou ...................... | H04B 10/272 398/101 |
| 9,110,264 B2* | 8/2015 | Aoki .................... | G02B 6/4269 |

OTHER PUBLICATIONS

PCT Search Report and Written Opinion dated Oct. 23, 2017, received in corresponding PCT Application No. PCT/US17/53421, 12 pgs.

* cited by examiner

*Primary Examiner* — Mukund G Patel
(74) *Attorney, Agent, or Firm* — Grossman Tucker Perrault & Pfleger, PLLC; Norman S. Kinsella

(57) ABSTRACT

A heat transfer assembly may be used to provide a thermal conduit from a module mounted on a circuit board through the circuit board, allowing a thermal path away from the module. The heat transfer assembly generally includes a thermally conductive base with at least one raised thermal pedestal accessible through at least one heat transfer aperture in the circuit board and in thermal contact with the module. In an embodiment, the heat transfer assembly is used in a remote PHY device (RPD) in an optical node, for example, in a CATV/HFC network. The RPD includes an enclosure having a base with at least one raised thermal pedestal in thermal contact with an optical module (e.g., an optical transmitter or transceiver) on a circuit board through at least one heat transfer aperture in the circuit board.

23 Claims, 4 Drawing Sheets

HEAT TRANSFER ASSEMBLY PROVIDING HEAT TRANSFER FROM A MODULE MOUNTED ON A CIRCUIT BOARD THROUGH THE CIRCUIT BOARD

TECHNICAL FIELD

The present disclosure relates to heat transfer in optoelectronic and electronic devices and more particularly, to a heat transfer assembly providing heat transfer from a module mounted on a circuit board through the circuit board.

BACKGROUND INFORMATION

Excessive heat can often adversely impact the performance of an electronic device such as an optoelectronic device. Thermal management within an enclosure of an electronic device is often a challenge, however, especially given performance demands and electrical and mechanical design constraints.

A remote optical node in a hybrid fiber-coaxial (HFC) network, such as a CATV network, is one example of an optoelectronic device that presents a unique challenge with thermal management. In a CATV/HFC network, the optical nodes are now being designed to include a remote PHY device (RPD), where the PHY was previously located in a cable modem termination system (CMTS) at a CATV headend of the network. The remote optical node may subject the RPD and the modules and components therein to high temperatures. The RPD includes, among other things, an optical transmitter or transceiver module, such as a small form-factor pluggable (SFP) module, with one or more lasers that may not perform properly at high temperatures. Because of the location of the laser(s) in the optical module, the desired orientation of the optical module, and the limited space within the RPD, effectively transferring the heat from the optical module is particularly challenging.

BRIEF DESCRIPTION OF THE DRAWINGS

These and other features and advantages will be better understood by reading the following detailed description, taken together with the drawings wherein.

DETAILED DESCRIPTION

A heat transfer assembly, consistent with embodiments of the present disclosure, may be used to provide a thermal conduit from a module mounted on a circuit board through the circuit board, allowing a thermal path away from the module. The heat transfer assembly generally includes a thermally conductive base with at least one raised thermal pedestal accessible through at least one heat transfer aperture in the circuit board and in thermal contact with the module. In an embodiment, the heat transfer assembly is used in a remote PHY device (RPD) in an optical node, for example, in a CATV/HFC network. The RPD includes an enclosure having a base with at least one raised thermal pedestal in thermal contact with an optical module (e.g., an optical transmitter or transceiver) on a circuit board through at least one heat transfer aperture in the circuit board.

By using the raised thermal pedestal accessible through a heat transfer aperture in the circuit board, the heat transfer assembly allows heat to be transferred from the best thermal exit on the bottom of the module. The thermal path is thus provided away from the side of the module generating the most heat and along the most direct path. Other attempts at heat transfer in a RPD, for example, have involved significant design changes such as flipping over the optical module and attaching the outward facing side of the module to a heat sink or heat pipe that runs around the circuit board. Other attempts used two separate circuit boards with connectors between the boards to avoid changing the orientation of the module. The heat transfer assembly, consistent with embodiments of the present disclosure, provides heat transfer more effectively along a more direct path away from the module while allowing the module to be mounted on the circuit board with the desired orientation.

Figure 1A:
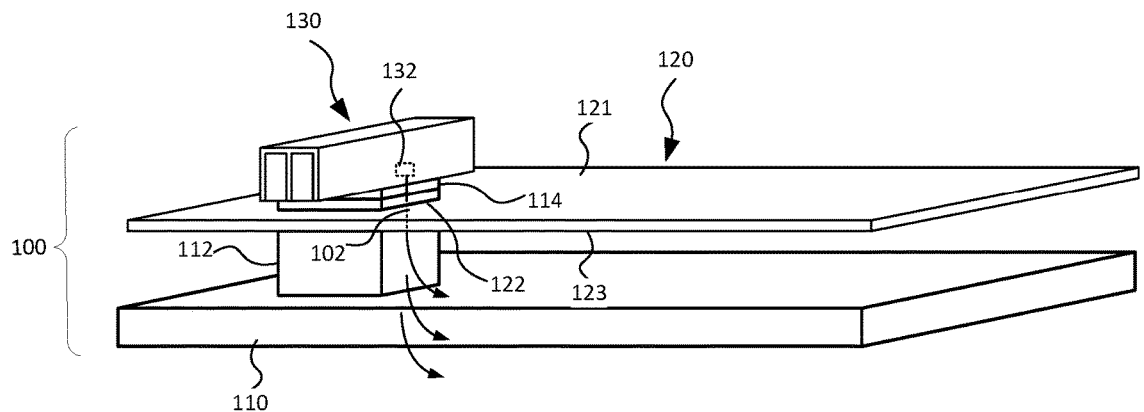
FIGS. 1A-1C are schematic views of heat transfer assemblies for providing heat transfer from a module mounted on a circuit board through the circuit board, consistent with embodiments of the present disclosure.
Figure 1B:
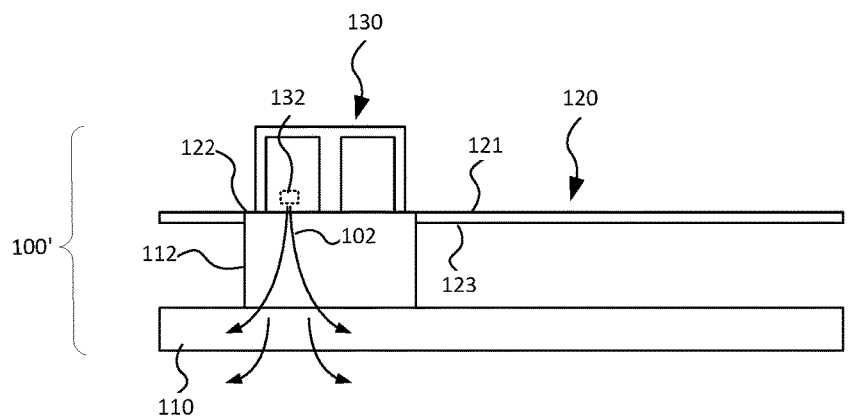
Figure 1C:
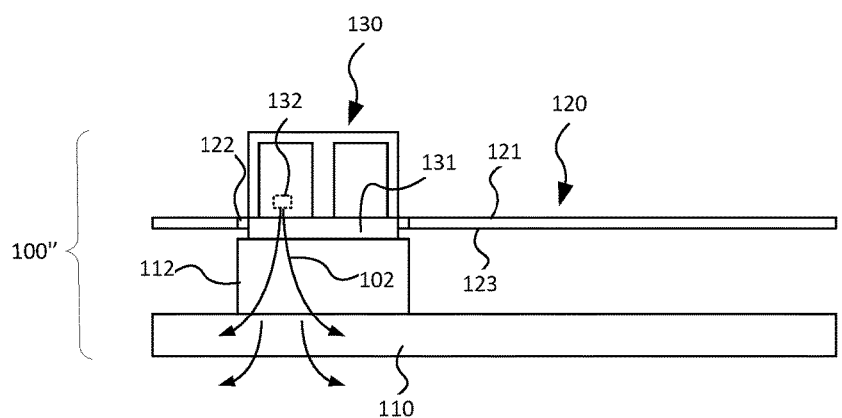

Referring to FIGS. 1A-1C, heat transfer assemblies 100, 100', 100'', consistent with embodiments of the present disclosure, are shown and described. In general, the heat transfer assemblies 100, 100', 100'' include a base 110 including at least one raised thermal pedestal 112 extending from the base 110 and a circuit board 120 including at least one heat transfer aperture 122 passing through the circuit board 120 from a first side 121 to a second side 123 of the circuit board 120. The circuit board 120 is mounted over the base 110 with the second side 123 facing the base 110 such that the raised thermal pedestal 112 is accessible through the heat transfer aperture 122 from the first side 121 of the circuit board 120.

A module 130, such as a mechanical enclosure or an electronic or optoelectronic module, is mounted to the circuit board 120 and in thermal contact with the raised thermal pedestal 112 through the heat transfer aperture 122, thereby providing a thermal conduit along a path 102 away from the module 130. As used herein, "thermal contact" refers to direct or indirect contact sufficient to allow heat to be conducted. FIG. 1A shows the raised thermal pedestal 112 in thermal contact with a portion of the module 130, but a greater or lesser portion of the module 130 may contact the thermal pedestal 112. The module 130 includes a heat generating component 132, for example, proximate a side of the module 130 facing the circuit board 120 and the thermal contact may be on or within a region of the module 130 including the heat generating component 132. Thus, the raised thermal pedestal 112 provides the best thermal exit for the heat generated in the module 130 and the most direct path for heat transfer away from the module 130 (e.g., as compared to a path from the top of the module 130 around the module 130 and the circuit board 120). The heat may be conducted through the pedestal 112 and through the base 110, thereby dissipating the heat.

The base 110 may be made of a thermally conductive metal, such as cast aluminum, and the raised thermal pedestal 112 may be formed as one piece with the base 110 from the same thermally conductive metal. The raised thermal pedestal 112 may also be attached to the base 110 in a manner that provides thermal conductivity between the pedestal 112 and the base 110. The raised thermal pedestal 112 may extend through the heat transfer aperture 122 and beyond the first side 121 of the circuit board 120 (FIG. 1A) or to the first side 121 of the circuit board 120 (FIG. 1B) such that the module 130 contacts the raised thermal pedestal 112. The raised thermal pedestal 112 may also extend below the first side 121 of the circuit board 120 or below the heat transfer aperture 122 (FIG. 1C) such that a portion 131 of the module 130 extends through the heat transfer aperture 122 to contact the raised thermal pedestal 112. Other configurations for providing thermal contact between the thermal pedestal 112 and the module 130 are also within the scope of the present disclosure.

The raised thermal pedestal 112 may also include a thermal medium or pad 114, such as a lithium grease or silicone based pad, which decreases rugosity or surface roughness to improve the heat transfer from the module 130 to the raised thermal pedestal 112. Other thermally conductive substances, materials or structures may also be used on the raised thermal pedestal 112 to improve heat transfer. The raised thermal pedestal 112 may also contact the module 130 directly. Although only one heat transfer aperture and one raised thermal pedestal are shown, other embodiments may include multiple raised thermal pedestals accessible through the same heat transfer aperture or through multiple respective heat transfer apertures.

Referring to FIGS. 2-8, a remote PHY device (RPD) 202 including a heat transfer assembly, consistent with an embodiment of the present disclosure, is described and shown in greater detail. As used herein, a "remote PHY device" or "RPD" refers to a device that includes PHY circuitry proximate the end of a network. The RPD 202 may be located in a remote optical node in a CATV/HFC network, and the heat transfer assembly may be used to improve heat transfer from an optical module in the RPD 202 to prevent high temperatures in the optical node from affecting the performance of the optical module in the RPD. The heat transfer assembly, consistent with the present disclosure, may also be used in other optoelectronic or electronic devices.

The RPD 202 includes a base 210, a printed circuit board 220 mounted to the base 210, and an optical transmitter or transceiver module 230, such as a small form-factor pluggable module, mounted to the circuit board 220. As used herein, small form-factor pluggable refers to the small-form factor pluggable (SFP) specification and any variations or versions thereof including, without limitation, SFP+, XFP, CFP and QSFP. The optical module 230 may be any known optical transmitter or transceiver module including one or more lasers 232 (see FIGS. 5 and 6) for generating and transmitting optical signals. In this embodiment, a cover portion 216 is mounted to the base 110 to form an enclosure around the circuit board 220 and the optical module 230. One or more handles 217 may extend from the cover portion 216 for handling the RPD 202. Other electronic and/or optoelectronic components may also be mounted to either side of the circuit board 220, for example, to provide the PHY functionality. In the illustrated embodiment, circuit board components 225a, 225b, such as FPGAs, memory chips, and microprocessors, are mounted on the second side 223 of the circuit board 220.

The base 210 includes at least one raised thermal pedestal 212 extending from the base 210. The base 210 and raised thermal pedestal 212 may be made of metal such as cast aluminum. The circuit board 220 includes at least one heat transfer aperture 222, which may be a cut-out from the circuit board 220, aligned with the thermal pedestal 212. The optical module 230 may be mounted to the circuit board 220 with at least a portion of the optical module 230 over the heat transfer aperture 222 for providing thermal contact with the thermal pedestal 212.

Figure 2:
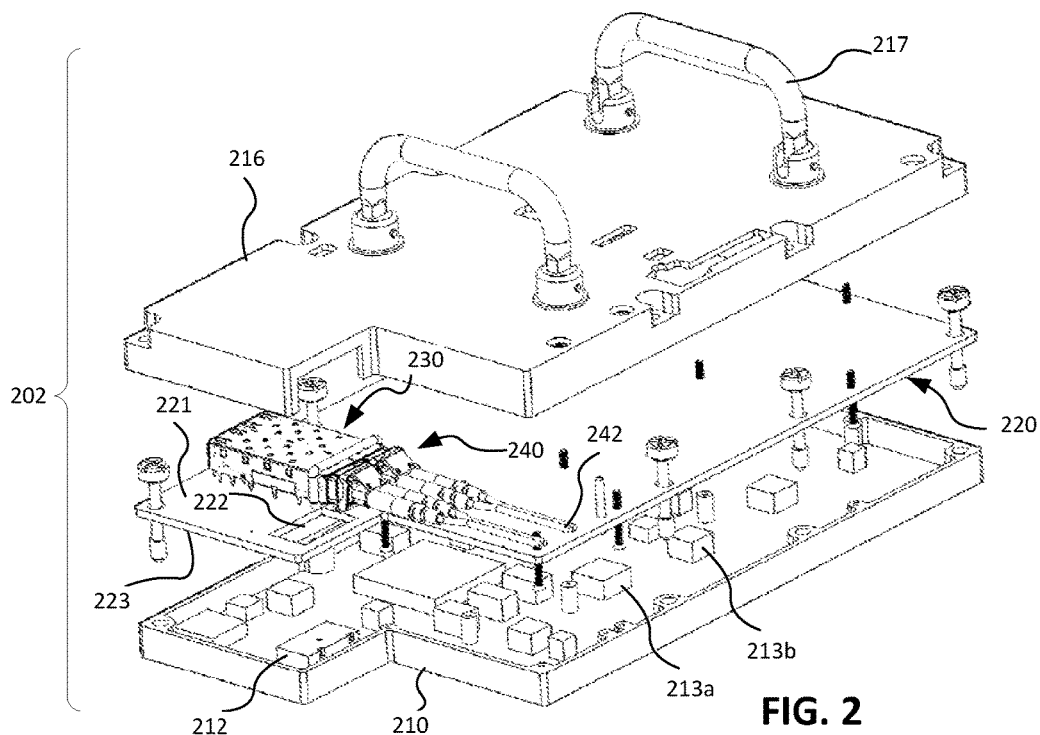
FIG. 2 is an exploded top perspective view of a remote PHY device (RPD) including a heat transfer assembly for providing heat transfer from an optical module mounted on a circuit board through the circuit board, consistent with an embodiment of the present disclosure.
Figure 3:
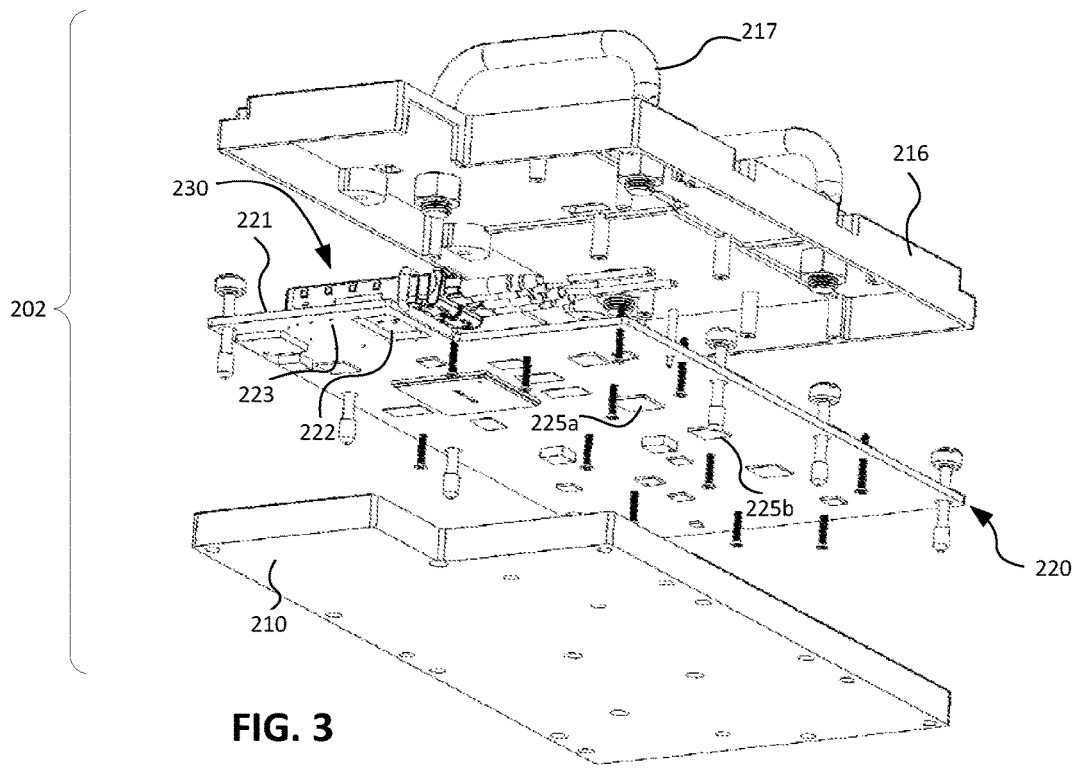
FIG. 3 is an exploded bottom perspective view of the RPD shown in FIG. 2.

In the illustrated embodiment, the base 210 includes additional raised thermal pedestals 213a, 213b, which provide thermal contact with other circuit board components 225a, 225b on the second side 223 of the circuit board 220 (see FIGS. 2 and 3). As such, the base 210 provides cooling for modules and components on both the first side 221 and the second side 223 of the circuit board 220, thereby lowering the thermal resistance of the RPD 202. In other embodiments, the circuit board 220 may include additional heat transfer apertures providing access to additional raised thermal pedestals on the base 210 for thermal contact with additional modules or components on the first side 221 of the circuit board 220.

Figure 4:
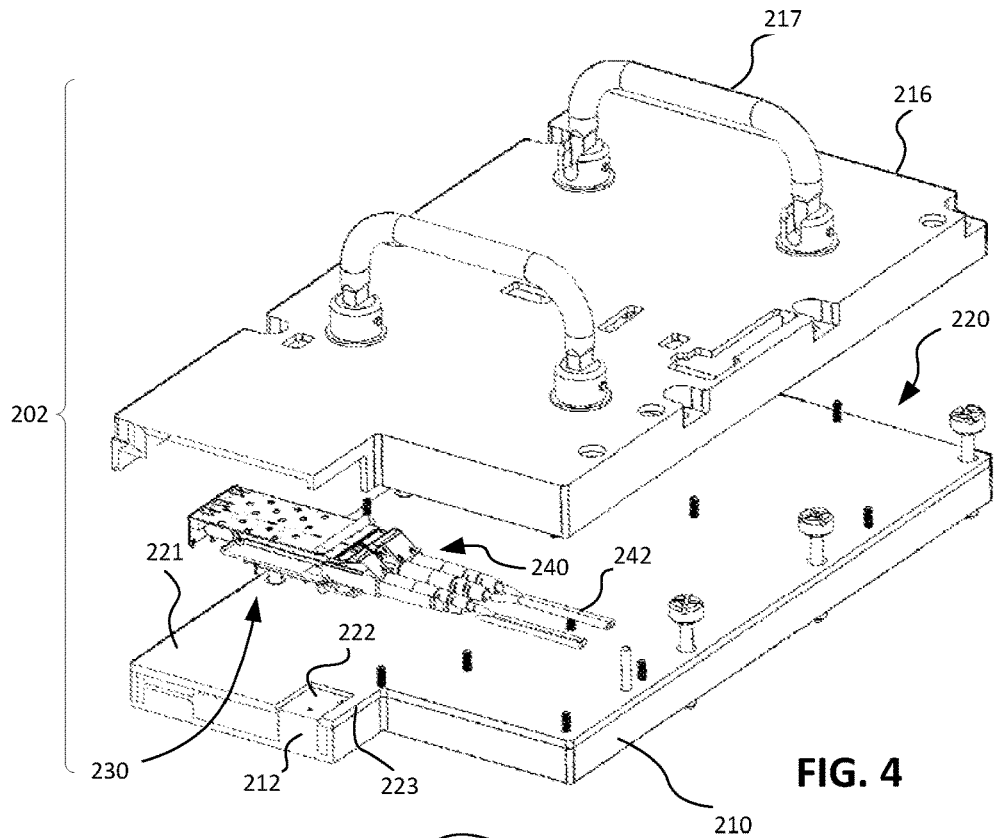
FIG. 4 is an exploded cross-sectional perspective view of the RPD shown in FIG. 2 with the circuit board positioned on a base including a raised thermal pedestal.
Figure 5:
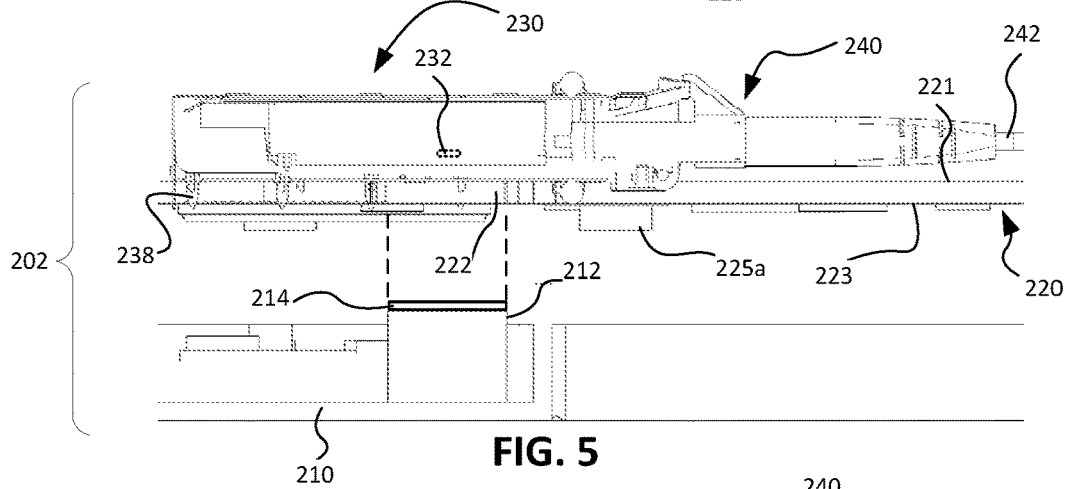
FIG. 5 is a side cross-sectional view of the RPD shown in FIG. 2 with the circuit board and the optical module separated from the base.
Figure 6:
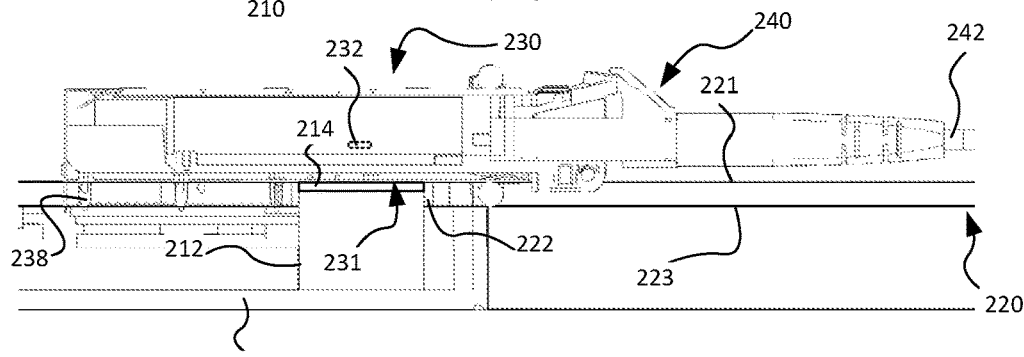
FIG. 6 is a side cross-sectional view of the RPD shown in FIG. 2 with the circuit board and the optical module mounted to the base.

As shown in greater detail in FIGS. 4-6, the heat transfer aperture 222 is aligned with and has a larger dimension than the raised thermal pedestal 212 such that the thermal pedestal 212 extends at least partially through the aperture 222. In the illustrated embodiment, the raised thermal pedestal 212 includes a thermal pad 214 and extends to about the level of the top surface 221 of the circuit board 220 when the circuit board 220 is mounted to the base 210 (see FIG. 6). The thermal pad 214 contacts a region 231 on the bottom of the optical module 230. The laser(s) 232 in the optical module 230 may be closer to the side of the module 230 facing the thermal pedestal 212 and within the boundaries of the region 231 contacting the thermal pedestal 212 to provide effective heat transfer. Although a particular shape and relative dimensions are shown, the heat transfer aperture 222 and the raised thermal pedestal 212 may have different shapes and/or dimensions. Also, multiple thermal pedestals may be used for the same module through the same heat transfer aperture or through multiple heat transfer apertures respectively.

The optical module 230 is physically mounted to the first side 221 of the circuit board 220 by using one or more mounting structures 238 to engage regions of the circuit board 220 around the heat transfer aperture 222. The optical module 230 is also electrically connected to the circuit board 220, for example, using wire leads (not shown) from conductive paths on the optical module 230 to conductive paths on the circuit board 220. The optical module 230 also provides an optical connection by receiving optical connectors 240 coupled to optical fibers 242.

Figure 7:
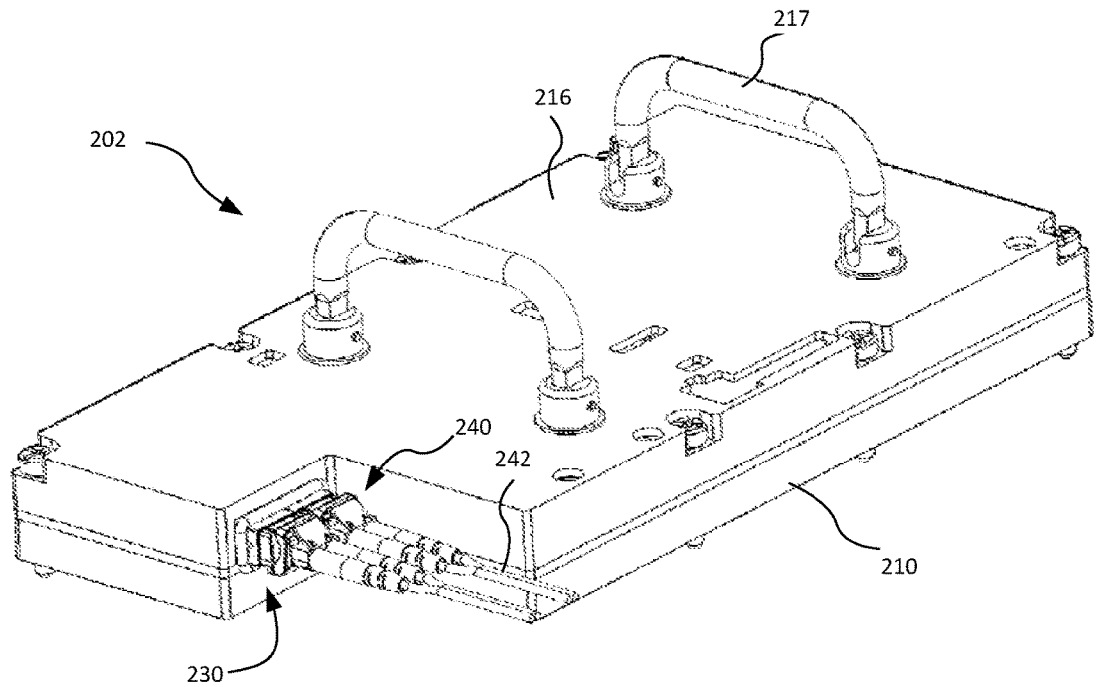
FIG. 7 is a perspective view of the RPD shown in FIG. 2 enclosed with the base and a cover.
Figure 8:
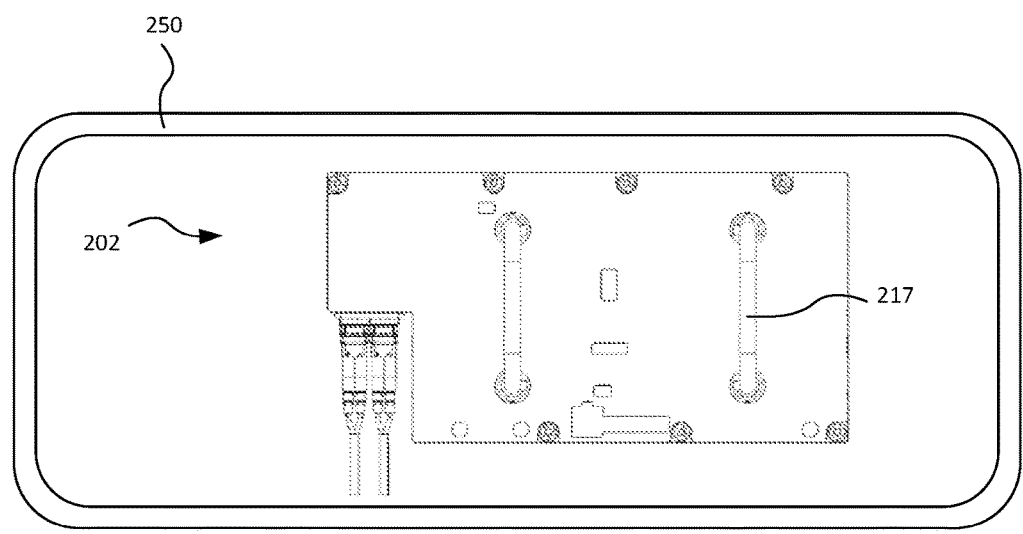
FIG. 8 is a top plan view of the enclosed RPD shown in FIG. 7 in a node housing of an optical node.

FIG. 7 shows the assembled and enclosed RPD 202 including the cover portion 216 mounted to the base 210. In the assembled RPD 202, the optical module 230 is positioned adjacent an opening in the cover portion 216 and/or base 210 to allow the optical connectors 240 to connect to the optical module 230. Thus, the orientation and location of the optical module 230 on the circuit board 220 and within the RPD 202 may be limited. As shown in FIG. 8, the assembled RPD 202 is located in a node housing 250, for example, together with the other electronic and/or optical equipment used in a remote optical node.

Accordingly, a heat transfer assembly, consistent with embodiments of the present disclosure, may be used to improve heat transfer from modules within an electronic or optoelectronic device, such as optical modules within a remote PHY device. The heat transfer may be improved by providing a more direct path for heat transfer from the heat generating region of the module without substantially changing the location or orientation of the module and within limited space.

Consistent with an embodiment, a heat transfer assembly includes a base including at least one raised thermal pedestal, which are made of metal, and a circuit board including a first side, a second side, and a heat transfer aperture passing through the circuit board from the first side to the second side. The circuit board is mounted over the base with the second side facing the base such that the raised thermal pedestal is accessible through the heat transfer aperture from the first side of the circuit board. A module is mounted to the first side of the circuit board over the heat transfer aperture and in thermal contact with the raised thermal pedestal providing a thermal conduit away from the module through the heat transfer aperture in the circuit board.

Consistent with another embodiment, a remote PHY device (RPD) includes an RPD enclosure having a base with at least one raised thermal pedestal and a circuit board including a first side, a second side, and a heat transfer aperture passing through the circuit board from the first side to the second side. The circuit board is mounted over the base with the first side facing the base such that the raised thermal pedestal is accessible through the heat transfer aperture from the first side of the circuit board. An optical module is mounted to the first side of the circuit board over the heat transfer aperture and in thermal contact with the raised thermal pedestal. The optical module including at least an optical transmitter.

Consistent with a further embodiment, an optical node includes a node housing and a RPD located in the node housing. The RPD includes an RPD enclosure having a base with at least one raised thermal pedestal and a circuit board including a first side, a second side, and a heat transfer aperture passing through the circuit board from the first side to the second side. The circuit board is mounted over the base with the first side facing the base such that the raised thermal pedestal is accessible through the heat transfer aperture from the first side of the circuit board. An optical module is mounted to the first side of the circuit board over the heat transfer aperture and in thermal contact with the raised thermal pedestal. The optical module including at least an optical transmitter.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A heat transfer assembly comprising:
    a base including at least one raised thermal pedestal, wherein the base is made of metal;
    a circuit board including a first side, a second side, and a heat transfer aperture passing through the circuit board from the first side to the second side, wherein the circuit board is mounted over the base with the second side facing the base such that the raised thermal pedestal is accessible through the heat transfer aperture from the first side of the circuit board; and
    a module mounted to the first side of the circuit board over the heat transfer aperture and in thermal contact with the raised thermal pedestal providing a thermal conduit away from the module through the heat transfer aperture in the circuit board, wherein:
        the raised thermal pedestal includes a thermal pad in contact with the module,
        the thermal pad does not extend between any portion of the circuit board and the module,
        the base includes at least one additional thermal pedestal, and
        the circuit board includes at least one electronic component mounted to the second side of the circuit board and in thermal contact with the at least one additional thermal pedestal.

2. The heat transfer assembly of claim 1, wherein the raised thermal pedestal extends through the heat transfer aperture.

3. The heat transfer assembly of claim 1, wherein the raised thermal pedestal extends above the first side of the circuit board.

4. The heat transfer assembly of claim 1, wherein the raised thermal pedestal extends to about a level of the first side of the circuit board.

5. The heat transfer assembly of claim 1, wherein the raised thermal pedestal extends below a level of the first side of the circuit board.

6. The heat transfer assembly of claim 1, wherein the module includes at least one heat generating component proximate a side of the electronic module facing the first side of the circuit board.

7. The heat transfer assembly of claim 1, wherein the module is an optoelectronic module.

8. The heat transfer assembly of claim 1, wherein the module is an optical transmitter including at least one laser, and wherein the laser is located proximate a side of the optical transmitter facing the first side of the circuit board.

9. The heat transfer assembly of claim 1, wherein the base includes a plurality of additional thermal pedestals and wherein the circuit board includes a plurality of electronic components mounted to the second side of the circuit board and in thermal contact with respective ones of the additional thermal pedestals.

10. The heat transfer assembly of claim 1, wherein at least the base is made of cast aluminum.

11. The heat transfer assembly of claim 1, further including an enclosure around the circuit board, wherein the enclosure includes the base and a cover over the base.

12. The heat transfer assembly of claim 1, wherein the raised thermal pedestal extends below a level of the second side of the circuit board.

13. A remote PHY device (RPD) comprising:
    an RPD enclosure having a base with at least one raised thermal pedestal,
    wherein at least the base is made of metal;
    a circuit board including a first side, a second side, and a heat transfer aperture passing through the circuit board from the first side to the second side, wherein the circuit board is mounted over the base with the first side facing the base such that the raised thermal pedestal is accessible through the heat transfer aperture from the first side of the circuit board; and an optical module mounted to the first side of the circuit board over the heat transfer aperture and in thermal contact with the raised thermal pedestal, the optical module including at least an optical transmitter, wherein:

the raised thermal pedestal includes a thermal pad in contact with the optical module, the thermal pad does not extend between any portion of the circuit board and the optical module, the base includes at least one additional thermal pedestal, and the circuit board includes at least one electronic component mounted to the second side of the circuit board and in thermal contact with the at least one additional thermal pedestal.

14. The RPD of claim 13, wherein the optical module is an optical transmitter including a laser.

15. The RPD of claim 14, wherein the laser is located proximate a side of the optical transmitter facing the first side of the circuit board.

16. The RPD of claim 13, wherein the optical module is a small form-factor pluggable module.

17. The RPD of claim 13, wherein the optical module is positioned adjacent the RPD enclosure and is configured to receive an optical connector for connecting to an optical fiber.

18. The RPD of claim 13, wherein the base includes a plurality of additional thermal pedestals, and wherein the circuit board includes a plurality of electronic components mounted to the second side of the circuit board and in thermal contact with respective ones of the additional thermal pedestals.

19. The RPD of claim 13, wherein the raised thermal pedestal extends to about a level of the first side of the circuit board.

20. An optical node comprising:

a node housing;

a remote PHY device (RPD) located in the node housing, the RPD comprising:

an RPD enclosure having a base with at least one raised thermal pedestal, wherein at least the base is made of metal;

a circuit board including a first side, a second side, and a heat transfer aperture passing through the circuit board from the first side to the second side, wherein the circuit board is mounted over the base with the first side facing the base such that the raised thermal pedestal is accessible through the heat transfer aperture from the first side of the circuit board; and an optical module mounted to the first side of the circuit board over the heat transfer aperture and in thermal contact with the raised thermal pedestal, the optical module including at least an optical transmitter, wherein:

the raised thermal pedestal includes a thermal pad in contact with the optical module, the thermal pad does not extend between any portion of the circuit board and the optical module, the base includes at least one additional thermal pedestal, and the circuit board includes at least one electronic component mounted to the second side of the circuit board and in thermal contact with the at least one additional thermal pedestal.

21. The optical node of claim 20, wherein the optical module is an optical transmitter including a laser.

22. The optical node of claim 21, wherein the laser is located proximate a side of the optical transmitter facing the first side of the circuit board.

23. The optical node of claim 20, wherein the optical module is a small form-factor pluggable module.

* * * * *